(12) United States Patent
Onishi et al.

(10) Patent No.: US 10,495,449 B2
(45) Date of Patent: Dec. 3, 2019

(54) OPTICAL MEASUREMENT DEVICE, OPTICAL MEASUREMENT METHOD, AND ROTARY MACHINE

(71) Applicant: MITSUBISHI HEAVY INDUSTRIES, LTD., Tokyo (JP)

(72) Inventors: Tomoyuki Onishi, Tokyo (JP); Akio Kondou, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 0 days.

(21) Appl. No.: 16/082,446

(22) PCT Filed: Mar. 10, 2017

(86) PCT No.: PCT/JP2017/009637
§ 371 (c)(1),
(2) Date: Sep. 5, 2018

(87) PCT Pub. No.: WO2017/155077
PCT Pub. Date: Sep. 14, 2017

(65) Prior Publication Data
US 2019/0086195 A1 Mar. 21, 2019

(30) Foreign Application Priority Data
Mar. 11, 2016 (JP) .................................. 2016-047845

(51) Int. Cl.
*G01B 11/16* (2006.01)
*G01L 1/24* (2006.01)
(Continued)

(52) U.S. Cl.
CPC .............. *G01B 11/18* (2013.01); *F01D 17/02* (2013.01); *F01D 21/003* (2013.01); *G01B 11/02* (2013.01);
(Continued)

(58) Field of Classification Search
CPC ......... G01B 11/18; G01B 11/16; G01B 11/14; G01B 11/02; G01M 15/14; G01M 7/025;
(Continued)

(56) References Cited

U.S. PATENT DOCUMENTS 5,757,492 A * 5/1998 Tokutomi ............... G01B 11/14
356/507
2002/0122613 A1 9/2002 Kittaka et al.
(Continued)

FOREIGN PATENT DOCUMENTS

JP 01-237618 9/1989
JP 2002-169022 6/2002
(Continued)

OTHER PUBLICATIONS

Written Opinion of the International Searching Authority dated Sep. 11, 2018 in International (PCT) Application No. PCT/JP2017/009637, with English Translation.
(Continued)

*Primary Examiner* — Dominic J Bologna
(74) *Attorney, Agent, or Firm* — Wenderoth, Lind & Ponack, L.L.P.

(57) ABSTRACT

The present invention includes: a laser that can change the emission wavelength of light; a light-emitting fiber that emits light output from the laser onto a rotor; a concave surface that is provided in a recessed manner in the rotor and reflects the light emitted from the light-emitting fiber; a light-receiving fiber that receives the light reflected by the concave surface; a photodetector that detects the intensity of the light received by the light-receiving fiber; and a control device that controls the laser and performs optical measurement. The intensity is detected by the photodetector while changing the emission wavelength of the laser; the emission wavelength at which the intensity is largest is selected; and optical measurement is performed by detecting the intensity of light reflected by the concave surface by using light having an emission angle determined by the selected emission wavelength.

13 Claims, 11 Drawing Sheets

(51) Int. Cl.
| | |
|---|---|
| *G01L 5/00* | (2006.01) |
| *G01L 3/10* | (2006.01) |
| *H01S 5/0687* | (2006.01) |
| *H01S 3/1055* | (2006.01) |
| *H01S 5/14* | (2006.01) |
| *F01D 21/00* | (2006.01) |
| *G01B 11/02* | (2006.01) |
| *G01B 11/14* | (2006.01) |
| *F01D 17/02* | (2006.01) |
| *G01H 9/00* | (2006.01) |
| *G01M 5/00* | (2006.01) |
| *G01M 7/02* | (2006.01) |
| *G01M 15/14* | (2006.01) |
| *G01H 1/00* | (2006.01) |

(52) U.S. Cl.
CPC .............. *G01B 11/14* (2013.01); *G01B 11/16* (2013.01); *G01H 9/004* (2013.01); *G01L 1/242* (2013.01); *G01L 3/10* (2013.01); *G01L 5/0009* (2013.01); *G01M 5/0066* (2013.01); *G01M 5/0091* (2013.01); *G01M 7/025* (2013.01); *G01M 15/14* (2013.01); *H01S 3/1055* (2013.01); *H01S 5/0687* (2013.01); *H01S 5/141* (2013.01); *F05D 2270/334* (2013.01); *F05D 2270/804* (2013.01); *G01H 1/003* (2013.01)

(58) Field of Classification Search
CPC .. G01M 5/0091; G01M 5/0066; G01H 9/004; G01H 1/003; F01D 17/02; F01D 21/003; G01L 5/0009; G01L 3/10; G01L 1/242; H01S 5/141; H01S 3/1055; H01S 5/0687; F05D 2270/334; F05D 2270/804
See application file for complete search history.

(56) References Cited

U.S. PATENT DOCUMENTS

| | | | |
|---|---|---|---|
| 2007/0279635 A1* | 12/2007 | Wu | G01B 11/14 356/445 |
| 2008/0204707 A1 | 8/2008 | Hwang et al. | |
| 2010/0158434 A1 | 6/2010 | Becker | |
| 2014/0104623 A1* | 4/2014 | Tsujii | G01J 3/0291 356/614 |

FOREIGN PATENT DOCUMENTS

| | | |
|---|---|---|
| JP | 2002-333376 | 11/2002 |
| JP | 2003-270255 | 9/2003 |
| JP | 2005-043150 | 2/2005 |
| JP | 2011-007678 | 1/2011 |
| WO | 2007/139262 | 12/2007 |

OTHER PUBLICATIONS

International Search Report dated May 30, 2017 in International (PCT) Application No. PCT/JP2017/009637, with English Translation.

* cited by examiner

OPTICAL MEASUREMENT DEVICE, OPTICAL MEASUREMENT METHOD, AND ROTARY MACHINE

TECHNICAL FIELD

The present invention relates to optical measurement devices, optical measurement methods and rotary machines.

BACKGROUND ART

In rotary machines, such as turbines, non-contact measurement is used. For example, in Patent Document 1, torque is measured by projecting laser light to a reflective sticker affixed to a rotor, detecting the reflected light with an optical sensor, and signal-processing the detection values. Also, in blade vibration measurement and clearance measurement in turbines, desired measurement values are obtained by projecting laser light to blades or a reflection target, detecting the reflected light with an optical sensor to detect passing time of the blades or the reflection target, and calculating data on the time difference.

PRIOR ART DOCUMENT

Patent Document

Patent Document 1: Japanese Patent Application Publication No. 2002-333376

SUMMARY OF THE INVENTION

Problems to be Solved by the Invention

In the case of performing measurement by projecting laser light from a stationary side to a rotary side and detecting changes in the reflected light as described above, there is a problem that the reflection intensity decreases over time due to contamination or other factors. For example, in the case of detecting passing time from changes in the reflected light as illustrated in the graph of FIG. 11, changes in the reflection intensity are large initially, and the detection of the passing time is easy. However, the reflection intensity decreases over time, increasing measurement errors, and measurement of the reflection intensity becomes impossible in the end.

The present invention has been made in view of the above problem, and an object thereof is to provide an optical measurement device, an optical measurement method and a rotary machine, capable of sustaining the reflection intensity.

Means for Solving the Problems

An optical measurement device according to a first aspect of the invention to solve the above problem comprises:
a wavelength tunable light source that outputs light and is capable of changing emission wavelength of the light;
a first optical fiber that projects the light outputted from the wavelength tunable light source, to a rotor;
a concave surface that is an ellipsoidal surface or parabolic surface formed to be recessed on the rotor and reflects the light projected from the first optical fiber;
a second optical fiber that receives the light reflected by the concave surface;
an intensity detector configured to detect intensity of the light received by the second optical fiber; and
a controller configured to control the wavelength tunable light source and performing optical measurement based on the intensity detected by the intensity detector, wherein
while the controller is changing the emission wavelength of the wavelength tunable light source, the controller detects the intensity with the intensity detector to select the emission wavelength that makes the intensity largest, and
the controller performs the optical measurement by detecting the intensity of the light reflected by the concave surface, using the light having an emission angle determined by the selected emission wavelength.

An optical measurement device according to a second aspect of the invention to solve the above problem is
the optical measurement device according to the first aspect of the invention, wherein
the concave surface is one of a colored surface, a mirror-finished surface, a diffuse reflective surface, and an enameled surface.

An optical measurement device according to a third aspect of the invention to solve the above problem is
the optical measurement device according to the first or second aspect of the invention, further comprising:
temperature detector configured to detect temperature of the rotor; and
revolution speed detector configured to detect revolution speed of the rotor, wherein
the controller estimates distance from a distal end of the first optical fiber to a surface of the rotor, based on the temperature detected by the temperature detector and the revolution speed detected by the revolution speed detector,
the controller sets the emission wavelength having an emission angle corresponding to the estimated distance, and
the controller performs the optical measurement by detecting the intensity of the light reflected by the concave surface, using the light having the emission angle determined by the set emission wavelength.

An optical measurement device according to a fourth aspect of the invention to solve the above problem is
the optical measurement device according to the third aspect of the invention, wherein
the controller estimates the distance from the distal end of the first optical fiber to the surface of the rotor, based on the temperature detected by the temperature detector and the revolution speed detected by the revolution speed detector,
the controller sets the emission wavelength having the emission angle corresponding to the estimated distance,
while the controller is changing the emission wavelength of the wavelength tunable light source in a wavelength range a center wavelength of which is the set emission wavelength, the controller detects the intensity with the intensity detector to select the emission wavelength that makes the intensity largest, and
the controller performs the optical measurement by detecting the intensity of the light reflected by the concave surface, using the light having an emission angle determined by the selected emission wavelength.

A rotary machine according to a fifth aspect of the invention to solve the above problem comprises
the optical measurement device according to any one of the first to fourth aspects of the invention.

An optical measurement method according to a sixth aspect of the invention to solve the above problem comprises:
outputting light from a wavelength tunable light source capable of changing emission wavelength of the light;
projecting the light outputted from the wavelength tunable light source, to a rotor, by using a first optical fiber;

reflecting the light projected from the first optical fiber, by a concave surface that is an ellipsoidal surface or parabolic surface formed to be recessed on the rotor;

receiving the light reflected by the concave surface, by using a second optical fiber;

detecting intensity of the light received by the second optical fiber, by using intensity detector; and while changing the emission wavelength of the wavelength tunable light source, detecting the intensity with the intensity detector to select the emission wavelength that makes the intensity largest, and performing optical measurement by detecting the intensity of the light reflected by the concave surface, using the light having an emission angle determined by the selected emission wavelength.

Effect of the Invention

According to the present invention, a concave surface formed on a rotor concentrates light reflected on the concave surface. In addition, even when the distance between the concave surface and the rotor changes, light at an emission wavelength having an emission angle that makes the reflection intensity largest is selected, or light at an emission wavelength having an emission angle corresponding to the distance is set, in order to keep the light receiving width at the concave surface the same. This makes it possible to sustain the light concentration effect by the concave surface.

MODE FOR CARRYING OUT THE INVENTION

Hereinafter, with reference to FIGS. 1 to 10, description will be provided for an embodiment of an optical measurement device, an optical measurement method and a rotary machine according to the present invention. Note that here, a rotor is illustrated as the rotor of a rotary machine, but the present invention can be applied to a shaft, a turbine, or the like as a rotor.

EXAMPLE 1

Figure 1:
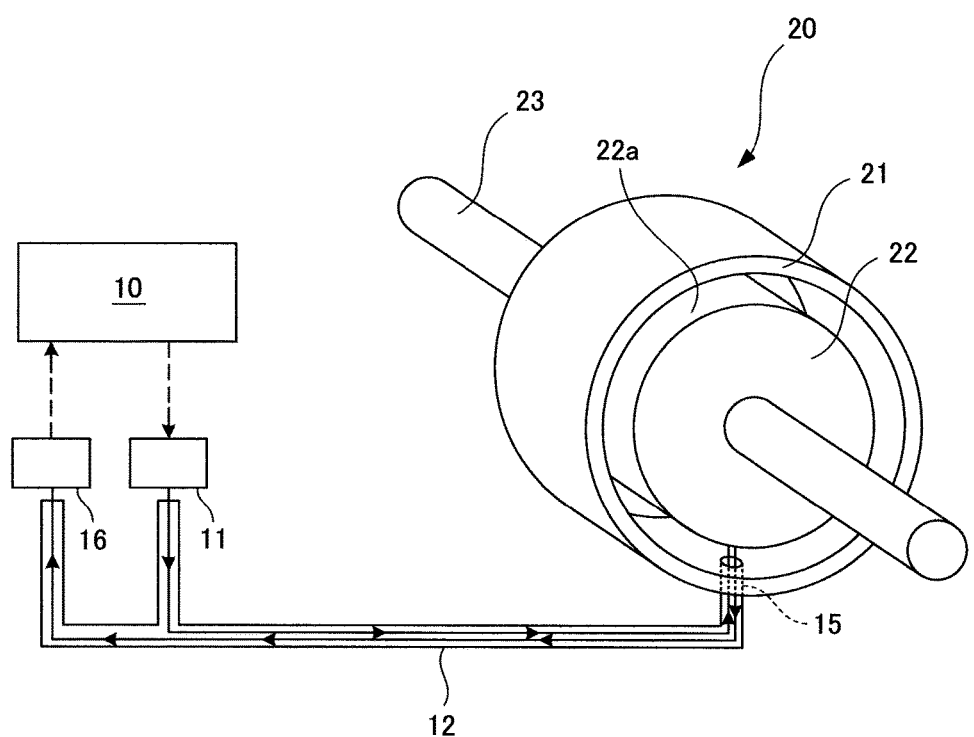
FIG. 1 is a schematic diagram illustrating an example (Example 1) of an embodiment of an optical measurement device and a rotary machine according to the present invention.

As illustrated in FIG. 1, an optical measurement device in this example has a control device 10, laser 11, optical fiber bundle 12, sensor head 15, and photodetector 16. The sensor head 15 is attached to a casing 21 of a rotary machine 20. Inside the casing 21 which is a stationary part are provided a rotor 22 which is a rotation unit (rotor) and a shaft 23 which rotatably supports the rotor 22, and the sensor head 15 attached to the casing 21 is disposed to face the cylindrical surface 22a (outer peripheral surface) of the rotor 22.

The laser 11 is a wavelength tunable light source that outputs laser light and is capable of changing the emission wavelength of the laser light. For example, a wavelength tunable semiconductor laser is suitable for the laser 11. Note that instead of such a semiconductor laser, a wavelength tunable gas laser, a wavelength tunable liquid laser, and a wavelength tunable solid laser can also be used for this purpose. In addition, if a wavelength conversion device is used, a laser having a fixed wavelength can also be used for this purpose.

Figure 2A:
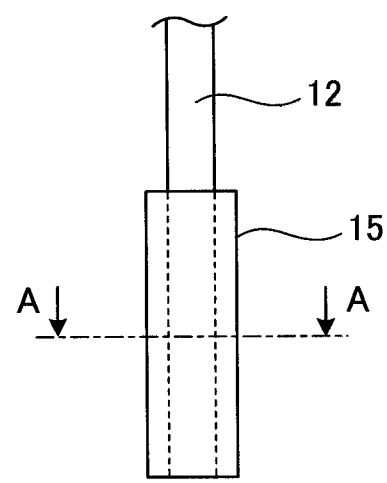
FIG. 2A is a schematic diagram illustrating an example of a sensor head in the optical measurement device illustrated in FIG. 1.
Figure 2B:
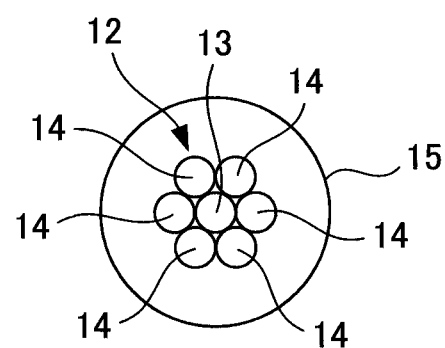
FIG. 2B is a cross-sectional view taken along line A-A and viewed from the arrows, which illustrates an example of a sensor head in the optical measurement device illustrated in FIG. 1.

The optical fiber bundle 12 includes a light emitting fiber 13 (first optical fiber) and multiple light receiving fibers 14 (second optical fibers) as illustrated in FIGS. 2A and 2B. The light emitting fiber 13 projects the laser light outputted from the laser 11 to the cylindrical surface 22a of the rotor 22, and the light receiving fibers 14 receive laser light reflected by a concave surface 24 described later.

In the sensor head 15, the optical fiber bundle 12 has the single light emitting fiber 13 disposed at the center and the multiple light receiving fibers 14 disposed around the light emitting fiber 13. The laser light projected from the light emitting fiber 13 is reflected by the concave surface 24 described later, and then received by the multiple light receiving fibers 14. Note that although here, the multiple light receiving fibers 14 are disposed to form a single layer around the single light emitting fiber 13, this arrangement may be changed as appropriate. For example, the number of layers of the multiple light receiving fibers 14 may be two, three, or more, and the number of the light emitting fiber 13 at the center may be increased.

The photodetector 16 (intensity detector) measures the reflection intensity of the laser light received by the multiple light receiving fibers 14 and is capable of measuring the reflection intensity of the laser light within the tunable wavelength range of the laser 11.

The control device 10 (controller) controls the laser 11 and performs control and calculation of optical measurement, which will be described later, based on the reflection intensity detected the photodetector 16.

Figure 3A:
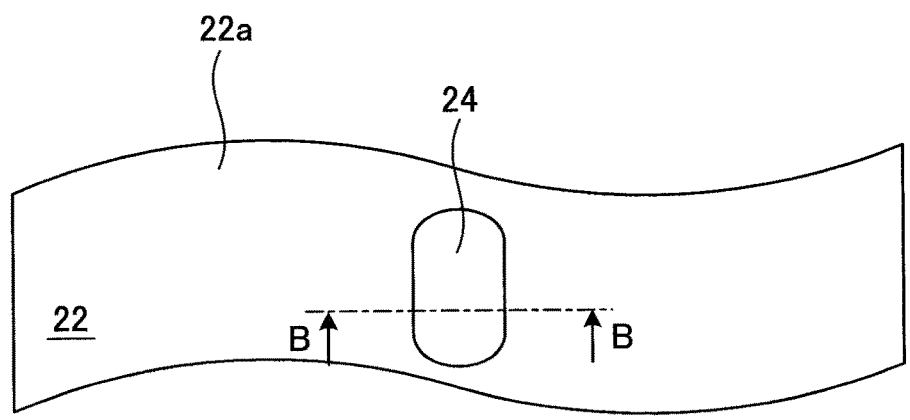
FIG. 3A is a schematic diagram illustrating an example of a concave surface which is a reflection target for the optical measurement device illustrated in FIG. 1.
Figure 3B:
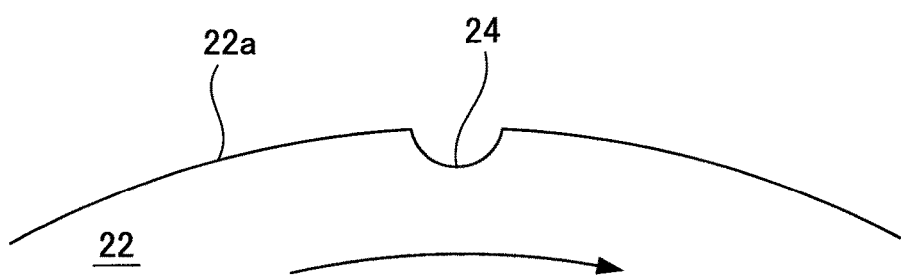
FIG. 3B is a cross-sectional view taken along line B-B and viewed from the arrows, which illustrates an example of a concave surface which is a reflection target for the optical measurement device illustrated in FIG. 1.

In addition, as illustrated FIGS. 3A and 3B, on the cylindrical surface 22a of the rotor 22 which is on the rotating side, the concave surface 24 which is a reflection target is formed to be recessed. This concave surface 24 reflects the laser light projected from the light emitting fiber 13 and concentrates it on the multiple light receiving fibers 14. The concave surface 24 is formed to be a concave curved surface, such as an ellipsoidal surface or a parabolic surface. Note that if the rotor is a shaft or turbine blades, the concave surface 24 can be formed on the cylindrical surface of the shaft, or the distal end of a turbine blade or the cylindrical surface of the turbine shroud.

Here, the eccentricity e of the concave surface 24 will be described. If the concave surface 24 is a parabolic surface (e=1), a parallel light ray is reflected from the concave surface 24, increasing the amount of reflected light, compared to the case of reflection on a plane surface. On the other hand, if the concave surface 24 is a cylindrical surface (e=0), the reflected light returns to the light emitting fiber 13 at the center, making less the amount of light returning to the surrounding light receiving fibers 14. Thus, it is necessary to reflect light having a width toward the surrounding light receiving fibers 14. For this reason, although the eccentricity e of the concave surface 24 is 0<e≤1, in other words, the concave surface 24 is an ellipsoidal surface or a parabolic surface, the eccentricity e is set based on the distance (hereinafter, clearance d) from the distal end of the light emitting fiber 13 (the sensor head 15) to the cylindrical surface 22a of the rotor 22 which is the measurement target and the diameter of the optical fiber bundle 12 in the sensor head 15.

In addition, to increase the laser-light reflectance of the concave surface 24, the concave surface 24 may be a surface colored by painting or thermal spraying (for example, a white colored surface), or a mirror-finished surface, a diffuse reflective surface, or an enameled surface.

The concave surface 24 formed in this manner on the cylindrical surface 22a of the rotor 22 concentrates the reflected light of the laser light projected from the light emitting fiber 13, on the multiple light receiving fibers 14, reducing the effect of the decrease in the reflection intensity over time. However, in such a structure, if clearance d changes, the light receiving width of the concave surface 24 also changes along with the change in clearance d, and this may reduce the light concentration effect.

Figure 4:
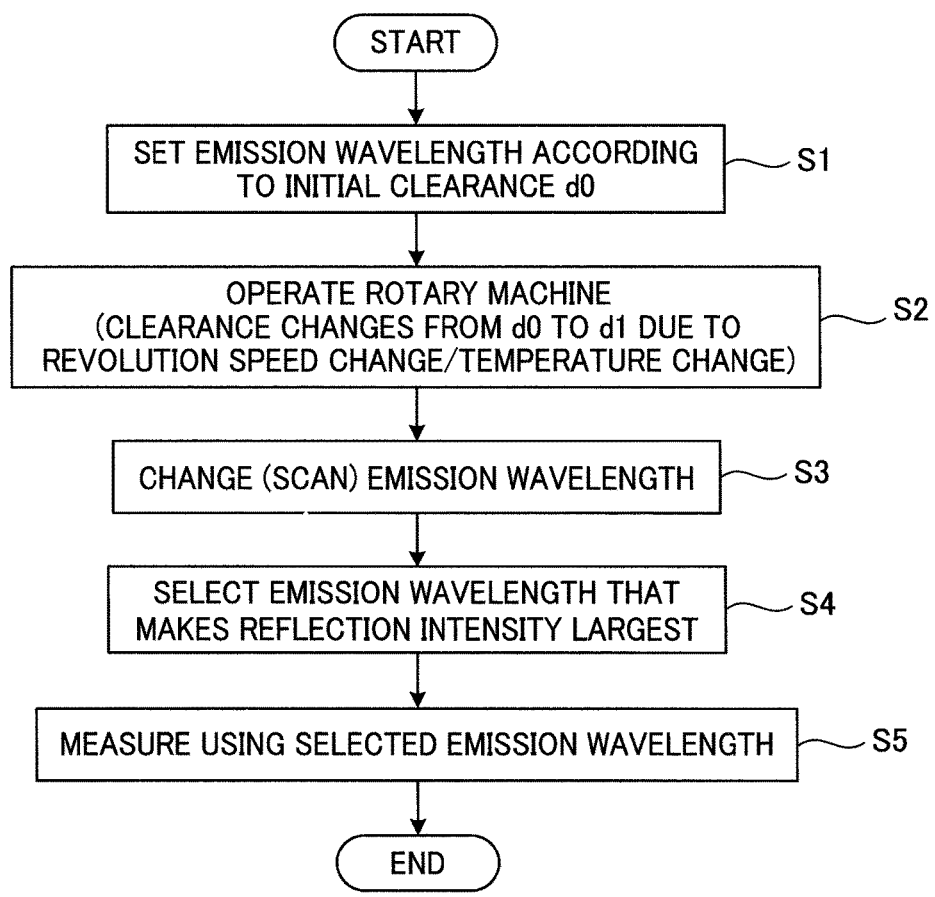
FIG. 4 is a flowchart for explaining an example of an optical measurement method for the optical measurement device illustrated in FIG. 1.

In light of the above point, in this example, the light concentration effect by the concave surface 24 is sustained by performing an optical measurement method illustrated in FIG. 4. With reference to FIGS. 1, 5, and 6 together with FIG. 4, the optical measurement method in this example will be described. Note that here description is provided by illustrating a case where clearance d1 during operation is larger than initial clearance d0 described later (d0<d1), but also in the opposite case, in other words, in a case where d0>d1, the same method can be used.

Step S1

The control device 10 selects the emission wavelength λ of the laser 11=λ0 according to initial clearance d0 which is an initial value of clearance d. As illustrated FIG. 5A, initial clearance d0 before operation of the rotary machine 20 is the distance between the distal end of the light emitting fiber 13 (the sensor head 15) and the cylindrical surface 22a of the rotor 22. Here, θ0 is the emission angle θ of the light emitting fiber 13 when the emission wavelength is λ0.

Here, as a premise of the calculation in FIGS. 5B, 5C and 5D, calculation of emission angle θ will be described with reference to FIG. 6. In FIG. 6, emission angle θ is equal to $2\theta_a$, $n_f$ is the refractive index of the core 13a of the light emitting fiber 13, and $n_c$ is the refractive index of the clad 13b of the light emitting fiber 13. Note that $n_i$ is the refractive index of air, and $\theta_c$ is the critical angle. Angle $\theta_a$, refractive indices $n_f$ and $n_c$ have the relationship expressed by the following formula, from which numerical aperture NA can be calculated.

$$\sin \theta_a = \sqrt{n_f^2 - n_c^2} = NA \qquad [\text{Math. 1}]$$

Using the above formula, angle $\theta_a$, in other words, emission angle θ can be obtained based on refractive indices $n_f$ and $n_c$. Since the refractive index $n_f$ of the core 13a varies depending on the wavelength of light (the prism principle), emission angle θ0 is obtained based on refractive index $n_f$ when the emission wavelength is λ0.

In this example, emission wavelength λ is changed, this changes the refractive index $n_f$ of the core 13a of the light emitting fiber 13, and this in turn changes emission angle θ (numerical aperture NA) of light from the light emitting fiber 13. Utilizing these changes provides emission angle θ corresponding to clearance d as described later.

For example, as illustrated in parts (a) and (b) of FIG. 5, it is assumed that the width of the concave surface 24 is 2.5 mm, initial clearance d0 is 4 mm, and emission wavelength λ0 is 486 nm (light blue). It is also assumed that when emission wavelength λ0 is 486 nm, refractive index $n_f$ is 1.5224, and refractive index $n_c$ is 1.4982. Calculation of the above formula based on these values yields NA=0.27, $\theta_a$=15.7°, and θ=θ0=31.4°. Then, when emission angle θ=θ0=31.4°, the light receiving width at the concave surface 24, when the initial clearance d0 is 4 mm, is 2.24 mm.

Figure 5A:
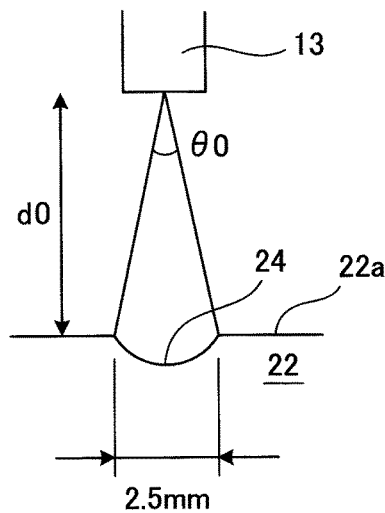
FIG. 5A is a diagram for explaining the relationship between a light emitting fiber and a concave surface.
Figure 5B:
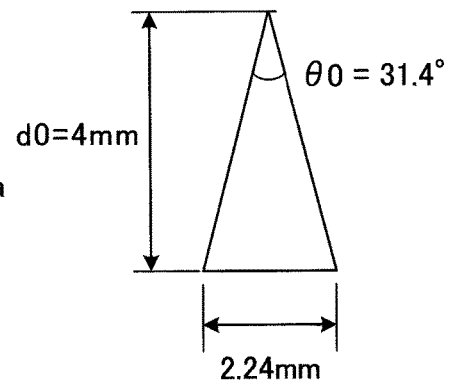
FIG. 5B is a diagram for explaining an emission angle before clearance change.
Figure 5C:
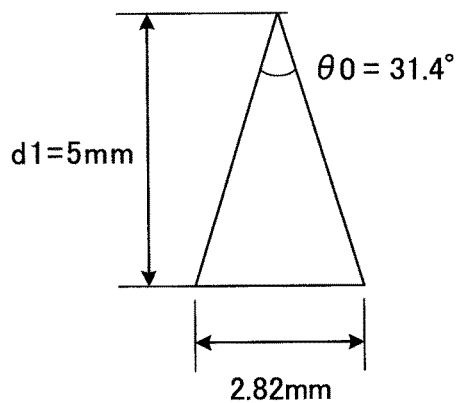
FIG. 5C is a diagram for explaining an emission angle after clearance change and before changing the wavelength.
Figure 6:
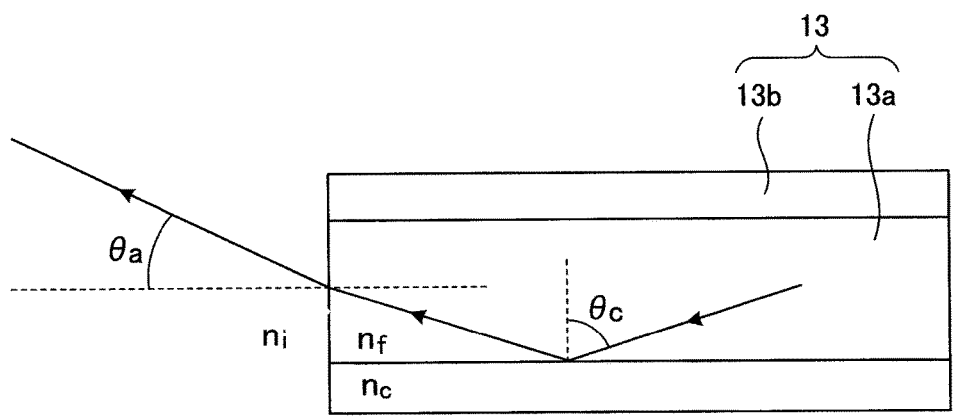
FIG. 6 is a diagram for explaining optical parameters of a light emitting fiber.

In summary, since emission wavelength λ is set to be λ0 (=486 nm) according to initial clearance d0, in other words, the light receiving width at the concave surface 24 before operation of the rotary machine 20, the laser light projected from the light emitting fiber 13 is emitted at emission angle θ=θ0=31.4° as illustrated in FIGS. 5A and 5B. As a result, the rotary machine 20 is in a state where the concave surface 24 can receive and reflect the light within the range of the width of the concave surface 24, and where the reflected light can be concentrated on the multiple light receiving fibers 14.

Step S2

After emission wavelength λ0 is selected, operation of the rotary machine 20 starts. Along with the operation of the rotary machine 20, the revolution speed change and temperature change of the rotor 22 cause clearance d to change from initial clearance d0 to d1.

For example, assume that the clearance is changed from initial clearance d0=4 mm by 1 mm to clearance d1=5 mm. Then, if the laser light projected from the light emitting fiber 13 keeps exiting at emission angle θ=θ0=31.4° as illustrated in FIG. 5C, the light receiving width of the concave surface 24, when clearance d1 is 5 mm, is 2.82 mm, which is larger than the light receiving width at the initial state by 0.6 mm. In other words, the laser light emitted from the light emitting fiber 13 at emission angle θ=θ0=31.4° has a light receiving width exceeding the width of the concave surface 24. As a result, all the projected laser light cannot be received and reflected by the concave surface 24, reducing the light concentration effect.

Steps S3 to S4

From the above viewpoint, in this example, while changing (scanning) the emission wavelength of the laser 11, the control device 10 detects the reflection intensity with the photodetector 16 to select the emission wavelength that makes the reflection intensity largest as the emission wavelength $\lambda=\lambda 1$ used for the measurement.

For example, assuming that emission wavelength $\lambda$ that makes largest the reflection intensity detected with the photodetector 16 is $1=656$ nm (red), refractive index $n_f$ in this case is 1.5143. Calculation of the above formula based on these values yields NA=0.22, $\theta_a=12.7°$, and $\theta=\theta 1=25.4°$. Then, when emission angle $\theta=\theta 1=25.4°$ as illustrated in FIG. 5D, the light receiving width at the concave surface 24, when clearance d0 is 5 mm, is 2.24 mm.

Figure 5D:
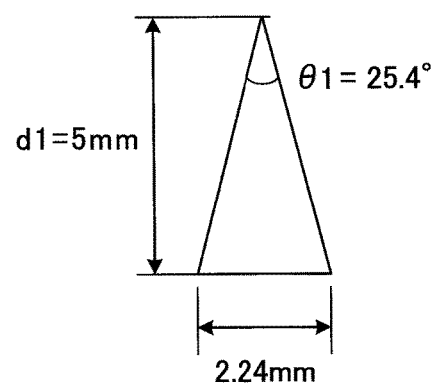
FIG. 5D is a diagram for explaining an emission angle after clearance change and after changing the wavelength.

In summary, since emission wavelength $\lambda$ is selected to be $\lambda 1$ (=656 nm), which makes the reflection intensity largest, during operation of the rotary machine 20, the laser light projected from the light emitting fiber 13 is emitted at emission angle $\theta=\theta 1=25.4°$ as illustrated in FIG. 5D. As a result, the rotary machine 20 is in a state where the concave surface 24 can receive and reflect the light within the range of the width of the concave surface 24, and where the reflected light can be concentrated on the multiple light receiving fibers 14. As described above, if emission angle $\theta$ needs to be reduced according to change in clearance d, the color of the laser light of the laser 11 needs to be changed from light blue to red to make the emission wavelength longer.

Step S5

The control device 10 detects the reflection intensity of light reflected from the concave surface 24 using emission wavelength $\lambda 1$ selected at step S4 and perform desired measurement based on the detected reflection intensity.

As described above, while changing the emission wavelength $\lambda$ of the laser 11, the optical measurement device detects the reflection intensity with the photodetector 16 and selects emission wavelength $\lambda$ that makes the reflection intensity largest to change the emission angle $\theta$ of the laser light. This in turn changes the light receiving width at the concave surface 24 according to clearance d. Thus, it is possible to select the emission wavelength that makes the light receiving width at the concave surface 24 remain the same even when clearance d is changed, and this makes it possible to sustain the light concentration effect by the concave surface 24.

Consequently, when the laser light projected from the light emitting fiber 13 passes on the concave surface 24, the reflected light is concentrated on the light receiving fibers 14 by the light concentration effect. This makes clearer peaks of the reflection intensity by the concave surface 24 and makes steep the rising edges and falling edges of the signal. As a result, even if there is a change over time, it is possible to reduce the influence of the change and perform desired measurement in an appropriate condition.

In addition, change in the light receiving width at the concave surface 24 along with change in clearance d may change the direction of the reflected light from the concave surface 24 having eccentricity e, reducing the light concentration effect. However, in this example, as described above, change in emission wavelength a, in other words, change in the emission angle $\theta$ of the laser light keeps the light receiving width at the concave surface 24 the same and also keeps the direction of the reflected light from the concave surface 24 unchanged. This point will be explained with reference to FIGS. 7A, 7B and 7C. Note that in FIGS. 7A, 7B and 7C, description will be provided illustrating outermost rays of the laser light from the light emitting fiber 13 for easier understanding.

Figure 7A:
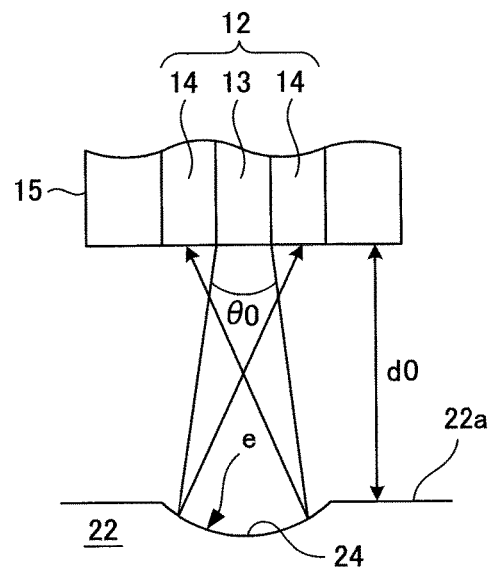
FIG. 7A is a diagram for explaining reflection of light before clearance change.

Before operation (at the initial state) of the rotary machine 20 illustrated in FIG. 7A, the eccentricity e of the concave surface 24 is set based on initial clearance d0, the diameter of the optical fiber bundle 12, and emission angle $\theta 0$ so that the outermost rays are reflected toward the light receiving fibers 14 when the light emitting fiber 13 faces the concave surface 24.

As described above, once operation of the rotary machine 20 starts, revolution speed change and temperature change along with the operation change clearance d from initial clearance d0 to d1. Also in this case, it is assumed that d0<d1.

Figure 7B:
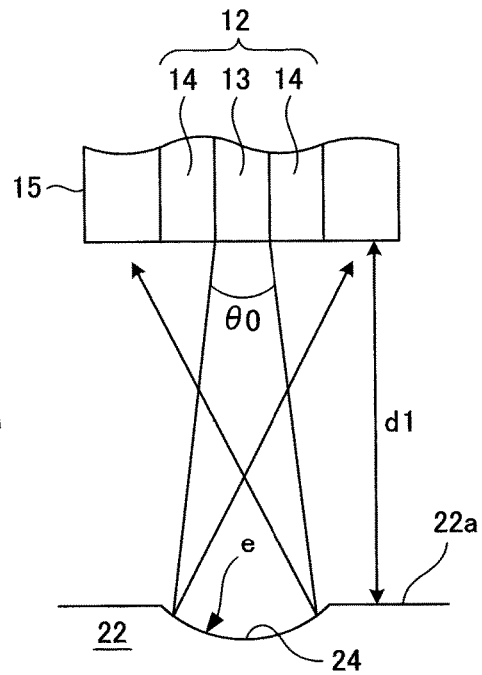
FIG. 7B is a diagram for explaining reflection of the light after clearance change and before changing the wavelength.

Then, during the operation of the rotary machine 20 illustrated in FIG. 7B, the clearance changes to clearance d1, and this changes the light receiving width at the concave surface 24. In this state, when the light emitting fiber 13 faces the concave surface 24, the outermost rays are reflected toward the outside of the light receiving fibers 14, reducing the light concentration effect by the concave surface 24.

Figure 7C:
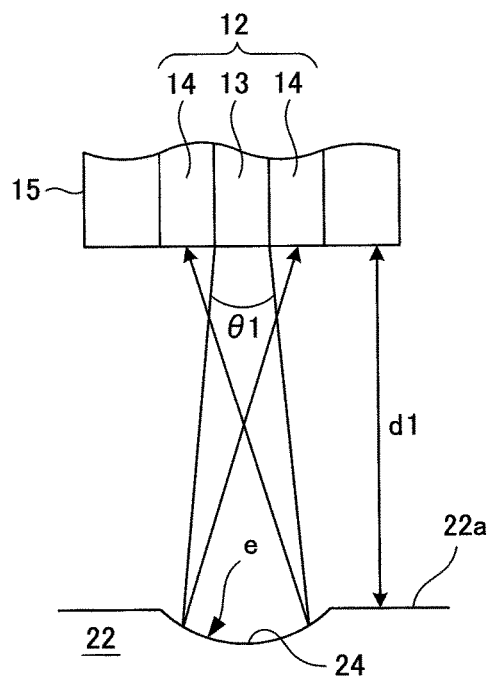
FIG. 7C is a diagram for explaining reflection of the light after clearance change and after changing the wavelength.

However, as described above, during the operation of the rotary machine 20, emission wavelength $\lambda 1$ that makes the reflection intensity largest is selected to keep the light receiving width at the concave surface 24 the same and also to keep the direction of the reflected light from the concave surface 24 the same. As a result, also in the state where the clearance has been changed to clearance d1 as illustrated in FIG. 7C, when the light emitting fiber 13 faces the concave surface 24, the outermost rays are reflected toward the light receiving fibers 14, making it possible to sustain the light concentration effect by the concave surface 24.

In this way, the direction of the reflected light from the concave surface 24 is also changed appropriately according to clearance d. Thus, even when clearance d changes, it is possible to sustain the light concentration effect by the concave surface 24. As a result, even if there is a change over time, it is possible to reduce the influence of the change and perform desired measurement in an appropriate condition.

EXAMPLE 2

An optical measurement device in this example is based on the optical measurement device illustrated in the above Example 1. Hence, here, the same constituents as illustrated in the optical measurement device in Example 1 illustrated in FIGS. 1 to 3 are denoted by the same reference signs, and description of the same constituents is omitted.

Figure 8:
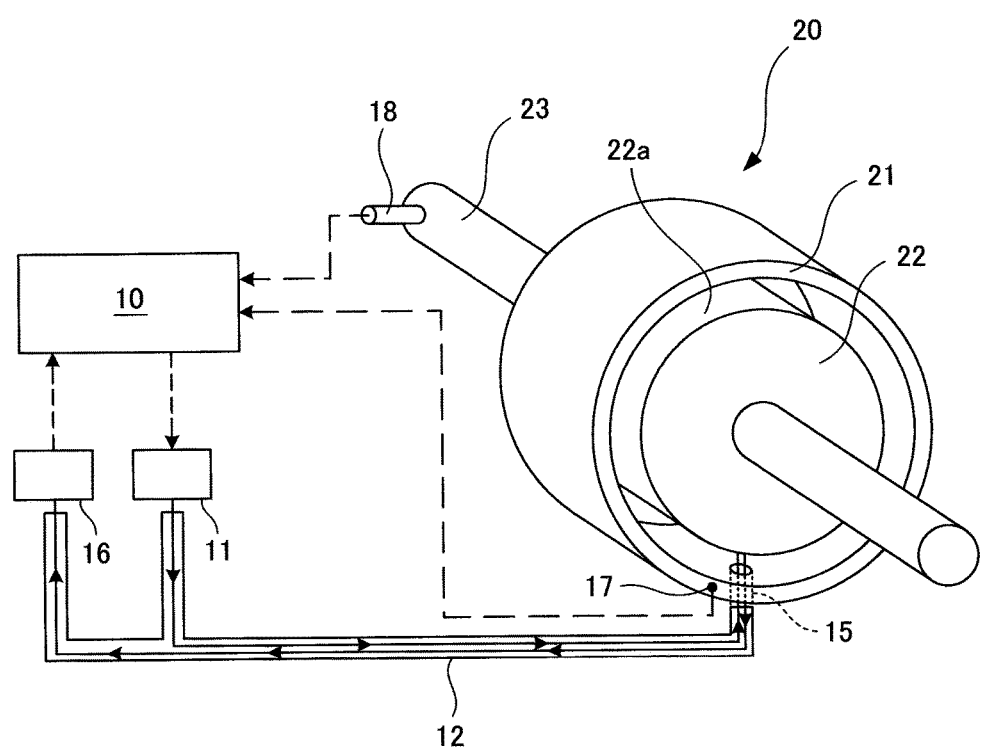
FIG. 8 is a schematic diagram illustrating another example (Example 2) of an embodiment of the optical measurement device and the rotary machine according to the present invention.
Figure 9:
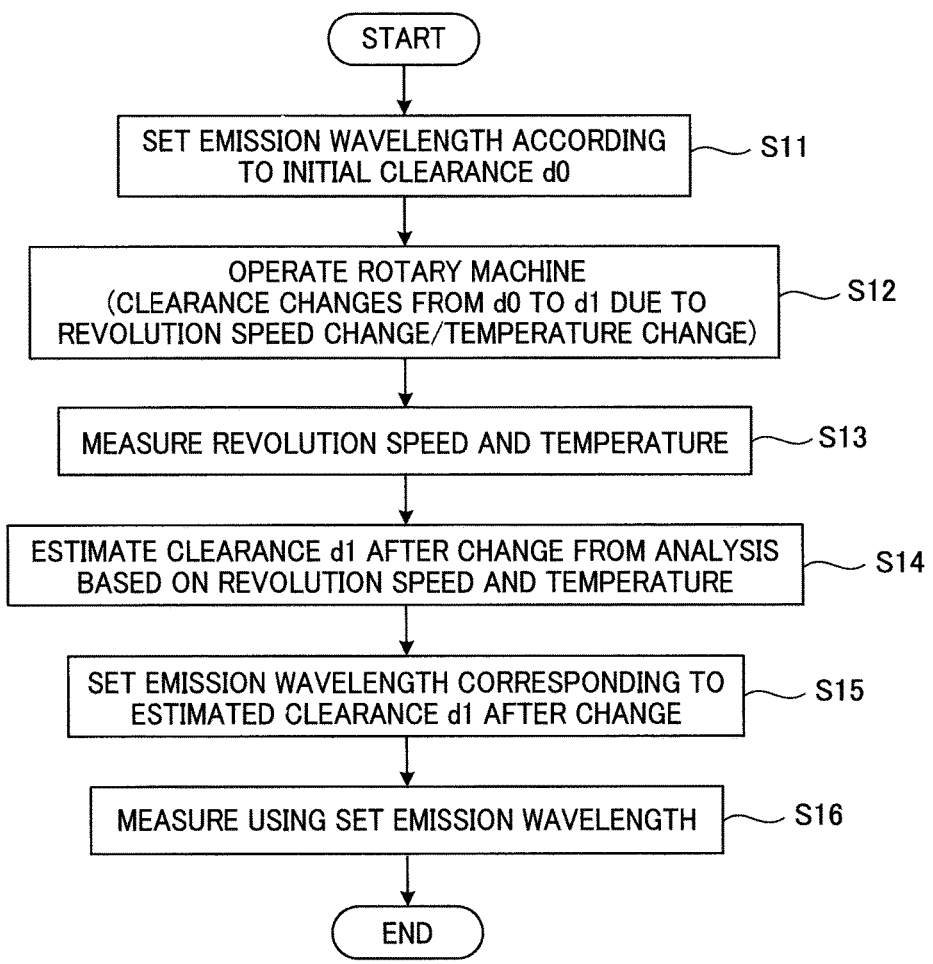
FIG. 9 is a flowchart for explaining an example of an optical measurement method for the optical measurement device illustrated in FIG. 8.

As illustrated in FIG. 8, the optical measurement device in this example further has a temperature sensor 17 (temperature detector) and a revolution speed indicator 18 (revolution speed detector). The temperature sensor 17, provided on the casing 21, measures the temperature of the rotor 22. The revolution speed indicator 18, provided on the shaft 23, measures the revolution speed of the shaft 23, in other words, the revolution speed of the rotor 22.

Also in this example, the emission angle $\theta$ of the laser light from the light emitting fiber 13 is changed according to clearance d by changing the emission wavelength of the laser 11 as in Example 1. In Example 1, after the emission wavelength of the laser 11 is scanned, the emission wavelength that makes the reflection intensity largest is selected. However, in this example, the change of clearance d is estimated based on temperature and revolution speed detected by the temperature sensor 17 and the revolution speed indicator 18 described above. The emission wavelength is set according to the estimated clearance d. Such an optical measurement method will be described with reference to FIG. 9 together with FIG. 8.

Step S11

As in step S1 in Example 1, the control device 10 selects the emission wavelength $\lambda$ of the laser 11=$\lambda$0 according to initial clearance d0.

Step S12

As in step S2 in Example 1, after emission wavelength $\lambda$0 is selected, operation of the rotary machine 20 starts. Along with the operation of the rotary machine 20, the revolution speed change and temperature change cause clearance d to change from initial clearance d0 to d1.

Step S13

The control device 10 measures the temperature and the revolution speed, using the temperature sensor 17 and the revolution speed indicator 18.

Step S14

The control device 10 estimates clearance d1 after change by analysis based on the temperature and the revolution speed measured by the temperature sensor 17 and the revolution speed indicator 18. For example, the control device 10 analyzes the displacement of the rotor 22 in terms of thermodynamics or kinematics and estimates clearance d1 based on the analysis result.

Step S15

The control device 10 sets emission wavelength $\lambda$=$\lambda$1 having the emission angle corresponding to the estimated clearance d1 based on the estimated clearance d1. For example, the emission angle is calculated which makes the light receiving width at the concave surface 24 at the time when the clearance is d1 equal to the light receiving width at the concave surface at the time when the clearance is d0. Then, emission wavelength $\lambda$1 corresponding to the emission angle is calculated.

Step S16

The control device 10 detects the reflection intensity of light reflected by the concave surface 24, using emission wavelength $\lambda$1 set at step S15, and performs desired measurement based on the detected reflection intensity.

Also in this example, even when clearance d is changed, light at the emission wavelength having the emission angle corresponding to clearance d is set to keep the light receiving width at the concave surface 24 the same. This makes it possible to sustain the light concentration effect by the concave surface 24.

EXAMPLE 3

Figure 10:
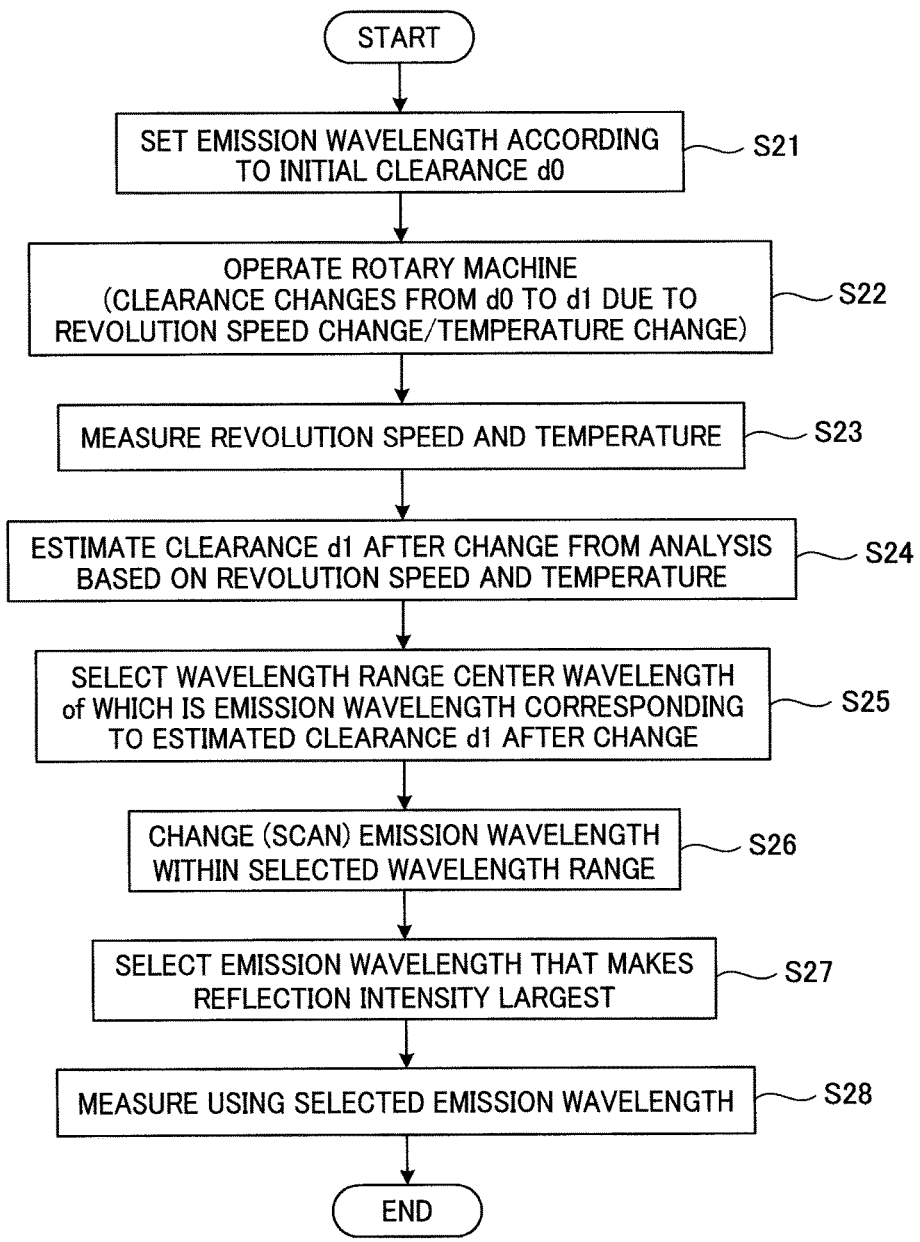
FIG. 10 is a flowchart for explaining another example (Example 3) of an optical measurement method for the optical measurement device illustrated in FIG. 8.
Figure 11:
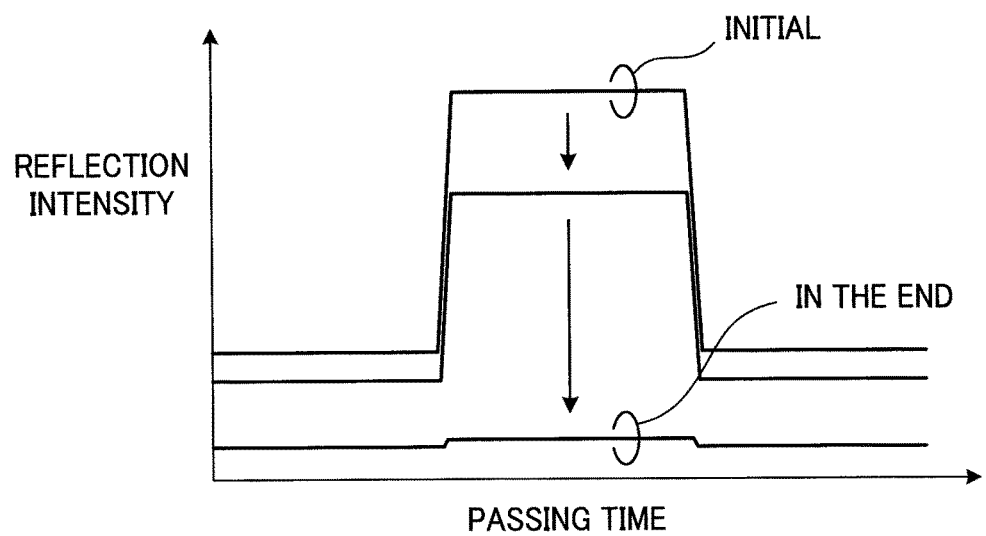
FIG. 11 is a graph for explaining decrease in the reflection intensity over time.

The optical measurement device in this example can be the same optical measurement device illustrated in the above Example 2, but the optical measurement method is different. Thus, illustration and description of the optical measurement device in this example are omitted. The optical measurement method is illustrated in FIG. 10, which will be explained also with reference to FIG. 8.

Step S21

As in step S1 in Example 1 and step S11 in Example 2, the control device 10 selects emission wavelength $\lambda$ of the laser 11=$\lambda$0 according to initial clearance d0.

Step S22

As in step S2 in Example 1 and step S12 in Example 2, after emission wavelength $\lambda$0 is selected, operation of the rotary machine 20 starts. Along with the operation of the rotary machine 20, the revolution speed change and temperature change cause clearance d to change from initial clearance d0 to d1.

Step S23

As in step S13 in Example 2, the control device 10 measures the temperature and the revolution speed, using the temperature sensor 17 and the revolution speed indicator 18.

Step S24

As in step S14 in Example 2, the control device 10 estimates clearance d1 after change by analysis based on the temperature and the revolution speed measured by the temperature sensor 17 and the revolution speed indicator 18.

Step S25

As in step S15 in Example 2, the control device 10 calculates emission wavelength $\lambda$=$\lambda$1 having the emission angle corresponding to the estimated clearance d1 based on the estimated clearance d1, and addition to it, the control device 10 also sets a wavelength range the center wavelength of which is emission wavelength $\lambda$1.

Steps S26 to S27,

While changing (scanning) the emission wavelength of the laser 11 in the set wavelength range, the control device 10 detects the reflection intensity with the photodetector 16 and selects the emission wavelength that makes the reflection intensity largest as the final emission wavelength $\lambda$=$\lambda$1.

Step S28

The control device 10 detects the reflection intensity of light reflected by the concave surface 24, using emission wavelength $\lambda$1 set at step S27, and performs desired measurement based on the detected reflection intensity.

Also in this example, even when clearance d is changed, light at the emission wavelength having the emission angle that makes the reflection intensity largest is selected to keep the light receiving width at the concave surface 24 the same. This makes it possible to sustain the light concentration effect by the concave surface 24.

INDUSTRIAL APPLICABILITY

The present invention is suitable for measurement for rotors of rotary machines (for example, turbomachines, such as turbines and compressors). For example, in a turbine, the present invention is applicable to measurement such as blade vibration measurement and clearance measurement for reducing internal leakage and avoiding rubbing.

REFERENCE SIGNS LIST 10 control device
11 laser
12 optical fiber bundle
13 light emitting fiber
14 light receiving fibers
15 sensor head
16 photodetector
17 temperature sensor
18 revolution speed indicator
20 rotary machine
22 rotor
22a cylindrical surface
24 concave surface

The invention claimed is:

1. A method for measuring distance from a measurement target by projecting a light to a light concentration surface of the measurement target and receiving the light reflected by the light concentration surface, comprising:

detecting intensity of the light reflected by the light concentration surface while changing emission wavelength of the light projected to the light concentration surface to select the emission wavelength that makes the intensity largest, and measuring the distance from the measurement target by projecting the light having an emission angle determined by the selected emission wavelength and by detecting the intensity of the light reflected by the light concentration surface.

2. An optical measurement device comprising:
a wavelength tunable light source that outputs light and is capable of changing emission wavelength of the light;
a first optical fiber that projects the light outputted from the wavelength tunable light source, to a rotor;
a concave surface that is an ellipsoidal surface or parabolic surface formed to be recessed on the rotor and reflects the light projected from the first optical fiber;
a second optical fiber that receives the light reflected by the concave surface;
an intensity detector configured to detect intensity of the light received by the second optical fiber; and
a controller configured to control the wavelength tunable light source and performing optical measurement based on the intensity detected by the intensity detector, wherein
while the controller is changing the emission wavelength of the wavelength tunable light source, the controller detects the intensity with the intensity detector to select the emission wavelength that makes the intensity largest, and
the controller performs the optical measurement by detecting the intensity of the light reflected by the concave surface, using the light having an emission angle determined by the selected emission wavelength.

3. The optical measurement device according to claim 2, wherein
the concave surface is one of a colored surface, a mirror-finished surface, a diffuse reflective surface, and an enameled surface.

4. The optical measurement device according to claim 2, further comprising:
temperature detector configured to detect temperature of the rotor; and
revolution speed detector configured to detect revolution speed of the rotor, wherein
the controller estimates distance from a distal end of the first optical fiber to a surface of the rotor, based on the temperature detected by the temperature detector and the revolution speed detected by the revolution speed detector,
the controller sets the emission wavelength having an emission angle corresponding to the estimated distance, and
the controller performs the optical measurement by detecting the intensity of the light reflected by the concave surface, using the light having the emission angle determined by the set emission wavelength.

5. The optical measurement device according to claim 4, wherein
the controller estimates the distance from the distal end of the first optical fiber to the surface of the rotor, based on the temperature detected by the temperature detector and the revolution speed detected by the revolution speed detector, the controller sets the emission wavelength having the emission angle corresponding to the estimated distance,
while the controller is changing the emission wavelength of the wavelength tunable light source in a wavelength range a center wavelength of which is the set emission wavelength, the controller detects the intensity with the intensity detector to select the emission wavelength that makes the intensity largest, and
the controller performs the optical measurement by detecting the intensity of the light reflected by the concave surface, using the light having an emission angle determined by the selected emission wavelength.

6. A rotary machine comprising the optical measurement device according to claim 5.

7. The optical measurement device according to claim 2, further comprising:
temperature detector configured to detect temperature of the rotor; and
revolution speed detector configured to detect revolution speed of the rotor, wherein
the controller estimates distance from a distal end of the first optical fiber to a surface of the rotor, based on the temperature detected by the temperature detector and the revolution speed detected by the revolution speed detector,
the controller sets the emission wavelength having an emission angle corresponding to the estimated distance, and
the controller performs the optical measurement by detecting the intensity of the light reflected by the concave surface, using the light having the emission angle determined by the set emission wavelength.

8. The optical measurement device according to claim 7, wherein
the controller estimates the distance from the distal end of the first optical fiber to the surface of the rotor, based on the temperature detected by the temperature detector and the revolution speed detected by the revolution speed detector,
the controller sets the emission wavelength having the emission angle corresponding to the estimated distance,
while the controller is changing the emission wavelength of the wavelength tunable light source in a wavelength range a center wavelength of which is the set emission wavelength, the controller detects the intensity with the intensity detector to select the emission wavelength that makes the intensity largest, and
the controller performs the optical measurement by detecting the intensity of the light reflected by the concave surface, using the light having an emission angle determined by the selected emission wavelength.

9. A rotary machine comprising the optical measurement device according to claim 2.

10. A rotary machine comprising the optical measurement device according to claim 3.

11. A rotary machine comprising the optical measurement device according to claim 4.

12. A rotary machine comprising the optical measurement device according to claim 7.

13. A rotary machine comprising the optical measurement device according to claim 8.

* * * * *